(12) United States Patent
Li

(10) Patent No.: US 11,437,357 B2
(45) Date of Patent: Sep. 6, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Jianwei Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 455 days.

(21) Appl. No.: 16/613,748

(22) PCT Filed: Sep. 23, 2019

(86) PCT No.: PCT/CN2019/107247
§ 371 (c)(1),
(2) Date: Nov. 14, 2019

(87) PCT Pub. No.: WO2020/258547
PCT Pub. Date: Dec. 30, 2020

(65) Prior Publication Data
US 2021/0343688 A1 Nov. 4, 2021

(30) Foreign Application Priority Data
Jun. 27, 2019 (CN) .......................... 201910565015.5

(51) Int. Cl.
*H01L 25/18* (2006.01)
*H04N 5/225* (2006.01)
(Continued)

(52) U.S. Cl.
CPC .............. *H01L 25/18* (2013.01); *G02B 5/208* (2013.01); *G02B 7/04* (2013.01); *G03B 11/00* (2013.01);
(Continued)

(58) Field of Classification Search
CPC . H01L 25/18; H01L 27/3234; H01L 51/0035; H01L 51/0097; H01L 27/323;
(Continued)

(56) References Cited

U.S. PATENT DOCUMENTS 9,353,224 B2 * 5/2016 Cho ........................ C08G 73/14
10,711,105 B2 * 7/2020 Miyamoto ........... C08K 5/5415
(Continued)

FOREIGN PATENT DOCUMENTS

CN 109120753 A 1/2019
CN 109285860 A 1/2019
(Continued)

*Primary Examiner* — Timothy J Henn

(57) ABSTRACT

A display panel and a display device are disclosed. The display panel includes a first substrate and a camera assembly. The first substrate includes a display area and a non-display area. The display area includes a flexible base substrate, a pixel array layer, a light-emitting layer, and a touch layer all sequentially disposed in a stacked arrangement. The camera assembly is disposed on a side of the display area adjacent to the flexible base substrate, so that an opening of the camera assembly of the display panel can be omitted, and a screen ratio of the display panel and the display device can be increased.

18 Claims, 4 Drawing Sheets

(51) Int. Cl.

| | | |
|---|---|---|
| *G02B 5/20* | (2006.01) | |
| *G02B 7/04* | (2021.01) | |
| *G03B 11/00* | (2021.01) | |
| *G03B 13/34* | (2021.01) | |
| *H01L 51/00* | (2006.01) | |
| *H01L 27/32* | (2006.01) | |
| *G06F 3/041* | (2006.01) | |

(52) U.S. Cl.
CPC .......... *G03B 13/34* (2013.01); *H01L 27/3234* (2013.01); *H01L 51/0035* (2013.01); *H01L 51/0097* (2013.01); *H04N 5/2254* (2013.01); *H04N 5/2257* (2013.01); *H04N 5/22525* (2018.08); *G06F 3/0412* (2013.01); *H01L 27/323* (2013.01); *H01L 2251/5338* (2013.01)

(58) Field of Classification Search
CPC .......... H01L 2251/5338; H01L 25/075; G02B 5/208; G02B 7/04; G02B 7/021; G02B 7/08; G03B 11/00; G03B 13/34; H04N 5/22525; H04N 5/2254; H04N 5/2257; G06F 3/0412; Y02E 10/549

See application file for complete search history.

(56) References Cited

U.S. PATENT DOCUMENTS

| | | | |
|---|---|---|---|
| 11,161,980 B2* | 11/2021 | Cho | .................. C08L 79/08 |
| 2015/0145969 A1 | 5/2015 | Kim et al. | |
| 2018/0260079 A1 | 9/2018 | Zhang | |
| 2019/0027709 A1* | 1/2019 | Zhang | .................. H01L 51/56 |
| 2020/0328373 A1* | 10/2020 | Huang | ................ H04M 1/0266 |
| 2020/0403186 A1* | 12/2020 | Choi | .................. H01L 51/56 |

FOREIGN PATENT DOCUMENTS

| | | |
|---|---|---|
| CN | 208384467 U | 1/2019 |
| CN | 208836246 U | 5/2019 |
| CN | 109920822 A | 6/2019 |
| CN | 110197846 A | 9/2019 |

* cited by examiner

DISPLAY PANEL AND DISPLAY DEVICE

BACKGROUND OF INVENTION

1. Field of Invention

The present invention relates to a technical field of displays, and particularly to, a display panel and a display device.

2. Related Art

With advancement of display technology, high screen ratio display devices have become one of the focuses on development of display panels, while flexible organic light-emitting diode (OLED) display devices have gradually become mainstream. Therefore, high-screen ratio or even full-screen flexible OLED display devices will become another peak in the development of display devices.

High-definition cameras are a major selling point for most display devices on the market, and users also have set an increasingly high standard for cameras. Taking selfies using front-facing cameras are becoming a common usage for many display device users.

Front-facing cameras have been widely used in selfie shooting. The front-facing cameras must operate under a light path, so a space between traditional cameras and display panels cannot be occupied by overlapping the cameras and the display panels because the display panels will block light from entering the cameras. Besides, the cameras have certain volume taking up certain space when the cameras and the display panels are alternately disposed, resulting in a situation that an area where the cameras are located is not allowed for displaying, which is an important reason why conventional display panels are configured with larger black edges. In order to achieve a high screen ratio or even full screen, camera holes on display panels must be integrated with display images or be discarded.

Accordingly, a problem exists that it is not likely to increase a screen ratio of current display devices due to the presence of front-facing cameras. Therefore, it is imperative to provide a display panel to overcome such a drawback.

SUMMARY OF INVENTION

Embodiments of the present disclosure are to provide a display panel and a display device to overcome a problem of failure to increase a screen ratio of conventional display devices because of disposing of front-facing cameras.

An embodiment of the present disclosure provides a display panel, comprising a first substrate comprising a display area and a non-display area, wherein the display area comprises a flexible base substrate, a pixel array layer, a light-emitting layer, and a touch layer all sequentially disposed in a stacked arrangement, and the flexible base substrate is a transparent flexible base substrate; and a camera assembly disposed on a side of the display area adjacent to the flexible base substrate.

According to one embodiment of the present disclosure, the flexible base substrate is made of a material containing transparent polyimide having a molecular structural formula as follows:

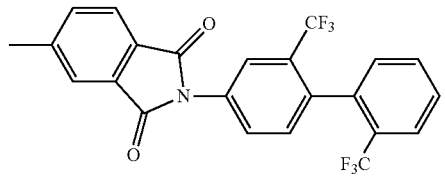 [SMILES: Cc1ccc2c(c1)C(=O)N(c1ccc(-c3ccccc3C(F)(F)F)c(C(F)(F)F)c1)C2=O]

According to one embodiment of the present disclosure, the camera assembly comprises a wire connecting substrate, an image sensor, an infrared filter, a focus motor, and a lens unit are all sequentially disposed in a stacked arrangement.

According to one embodiment of the present disclosure, the lens unit is disposed away from the first substrate, and the wire connecting substrate is disposed on a side adjacent to the first substrate.

According to one embodiment of the present disclosure, a backplate is disposed on a side of the lens unit away from the first substrate, a protection lens is disposed between the lens unit and the backplate, and the protection lens is configured to protect the lens unit.

According to one embodiment of the present disclosure, a transparent area is defined on the backplate, a second display area is defined on an area where the display area faces the transparent area, and a transparent viewing window is defined by both the second display area and the transparent area, wherein the second display area is configured to display an image captured by the camera assembly, and the transparent viewing window is configured to enable viewing of the image through the transparent area.

According to one embodiment of the present disclosure, the display panel further comprises a battery and a chip, wherein the battery and the chip are disposed in a portion between the first substrate and the backplate other than the transparent viewing window.

According to one embodiment of the present disclosure, the lens unit is disposed on a side of the display panel adjacent to the first substrate, and the wire connecting substrate is disposed on a side of the display panel away from the first substrate.

According to one embodiment of the present disclosure, the display panel further comprises a polarizer, wherein the polarizer is disposed on a side of the touch layer away from the flexible base substrate, the polarizer has a thickness between 140 microns (um) and 160 um, and the flexible base substrate has a thickness between 45 um and 55 um.

An embodiment of the present disclosure provides a display panel comprising a first substrate comprising a display area and a non-display area, wherein the display area comprises a flexible base substrate, a pixel array layer, a light-emitting layer, and a touch layer all sequentially disposed in a stacked arrangement, and the flexible base substrate is a transparent flexible base substrate; and a camera assembly disposed on a side of the display area adjacent to the flexible base substrate, and comprising a wire connecting substrate, an image sensor, an infrared filter, a focus motor, and a lens unit all sequentially disposed in a stacked arrangement; wherein the lens unit is disposed on a side of the display panel away from the first substrate, and the wire connecting substrate is disposed on a side of the display panel adjacent to the first substrate.

According to one embodiment of the present disclosure, the flexible base substrate is made of a material containing transparent polyimide having a molecular structural formula as follows:

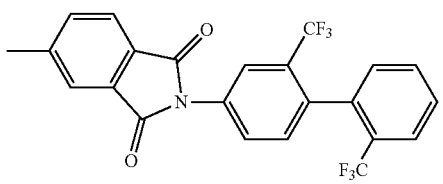 [SMILES: Cc1ccc2c(c1)C(=O)N(c1ccc(-c3ccccc3C(F)(F)F)c(C(F)(F)F)c1)C2=O]

According to one embodiment of the present disclosure, a backplate is disposed on a side of the lens unit away from the first substrate, a protection lens is disposed between the lens unit and the backplate, and the protection lens is configured to protect the lens unit.

According to one embodiment of the present disclosure, a transparent area is disposed on the backplate, a second display area is defined in an area where the display area faces the transparent area, and a transparent viewing window is defined by both the second display area and the transparent area, wherein the second display area is configured to display an image captured by the camera assembly, and the transparent viewing window is configured to enable viewing of the image through the transparent area.

According to one embodiment of the present disclosure, the display panel further comprises a battery and a chip, wherein the battery and the chip are disposed in a portion between the first substrate and the backplate other than the transparent viewing window.

According to one embodiment of the present disclosure, the lens unit is disposed on a side of the display panel adjacent to the first substrate, and the wire connecting substrate is disposed on a side of the display panel away from the first substrate.

According to one embodiment of the present disclosure, the display panel further comprises a polarizer, wherein the polarizer is disposed on a side of the touch layer away from the flexible base substrate, the polarizer has a thickness between 140 microns (um) and 160 um, and the flexible base substrate has a thickness between 45 um and 55 um.

An embodiment of the present disclosure further provides a display device, comprising a display panel, the display panel comprising a first substrate comprising a display area and a non-display area, wherein the display area comprises a flexible base substrate, a pixel array layer, a light-emitting layer, and a touch layer all sequentially disposed in a stacked arrangement, and the flexible base substrate is a transparent flexible base substrate; and a camera assembly disposed on a side of the display area adjacent to the flexible base substrate.

According to one embodiment of the present disclosure, the flexible base substrate is made of a material containing transparent polyimide having a molecular structural formula as follows:

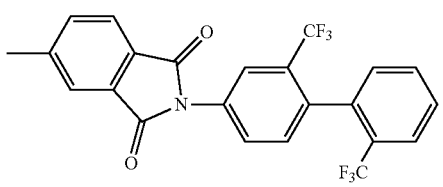

According to one embodiment of the present disclosure, the camera assembly comprises a wire connecting substrate, an image sensor, an infrared filter, a focus motor, and a lens unit are all sequentially disposed in a stacked arrangement.

According to one embodiment of the present disclosure, the lens unit is disposed on a side of the display panel away from the first substrate, and the wire connecting substrate is disposed on a side of the display panel adjacent to the first substrate.

The present disclosure has advantageous effects as follows: based on the embodiment of the present disclosure, the flexible base substrate of the display area of the first substrate is formed as a transparent flexible base substrate to improve light transmittance of the first substrate. Furthermore, the camera assembly is disposed on a side of the display area adjacent to the flexible base substrate, so that when displaying by default, the first substrate displays images as normal, and when taking pictures, a portion of the display area corresponding to the camera assembly exhibits a transparent state, light passes through the first substrate to the camera assembly to enable image shooting, thereby achieving a configuration that the camera assembly is disposed under the display area, omitting an opening of the camera assembly, and thus increasing a screen ratio of the display panel.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

The disclosure will be further described below along with the accompanying drawings and specific embodiments:

A First Embodiment

The embodiment of the present disclosure provides a display panel. The following disclosure is described in detail along with FIGS. 1 to 3.

Figure 1:
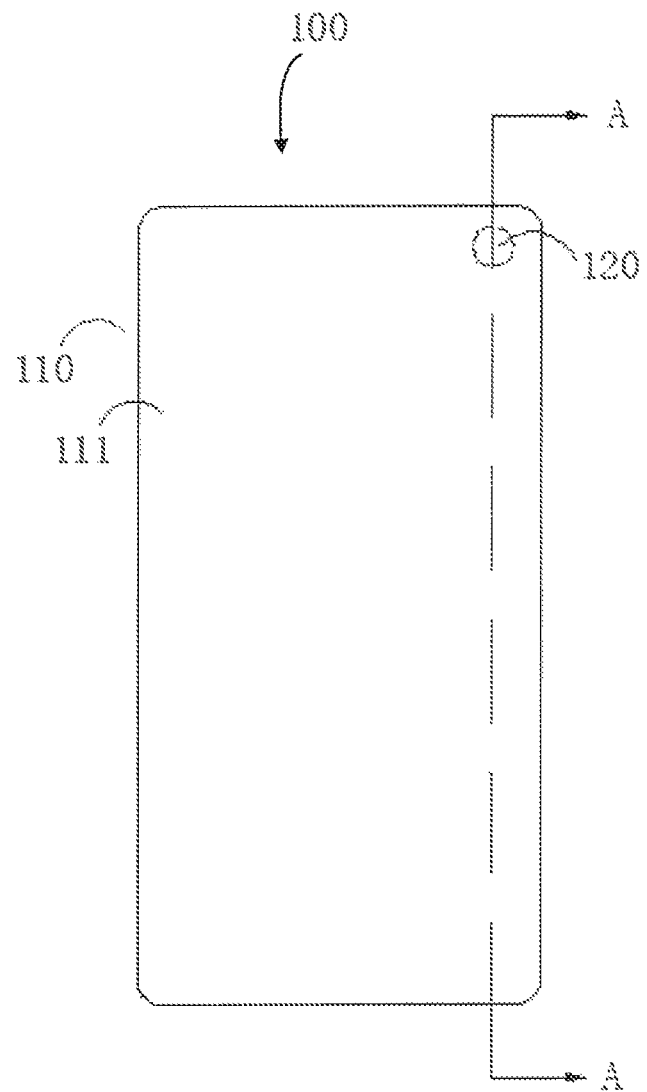
FIG. 1 is a schematic view of a display panel of a first embodiment of the present disclosure.

As shown in FIG. 1, FIG. 1 is a schematic plan view of a display panel 100 of the embodiment of the present disclosure. The display panel 100 includes a first substrate 110. The first substrate 110 includes a display area 111 and a non-display area (not shown).

Figure 2:
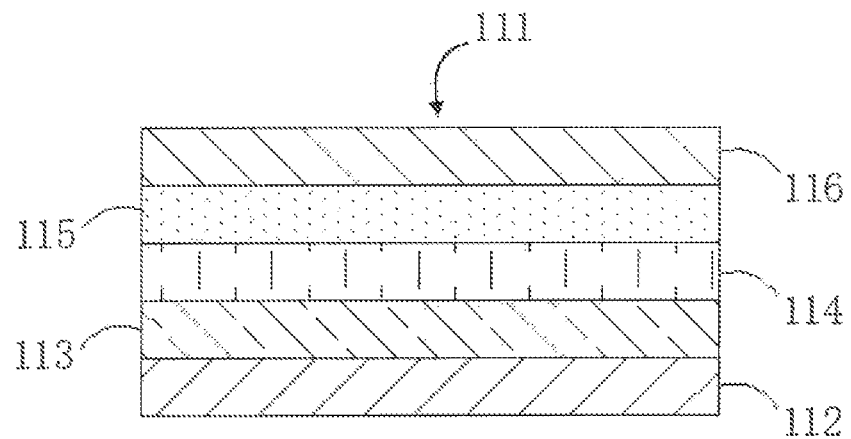
FIG. 2 is a schematic structural view showing a cross-section taken along line A-A of a display area of the first embodiment of the present disclosure.

Specifically, as shown in FIG. 2, FIG. 2 is a schematic structural view showing a cross-section taken along line A-A of the display area 111 of the first embodiment of the present disclosure. The display area 111 includes a flexible base substrate 112, a pixel array layer 113, a light-emitting layer 114, and a touch layer 115 all sequentially disposed in a stacked arrangement. The flexible base substrate 112 is a transparent flexible base substrate, and the pixel array layer 113, the light-emitting layer 114, and the touch layer 115 are all transparent layers, thereby to increase light transmittance of the display area 111.

As shown in FIG. 1, the display panel 100 further includes a camera assembly 120. The camera assembly 120 is disposed on a side of the display area 111 adjacent to the flexible base substrate 112.

Preferably, the camera assembly 120 is polygonal, circular, and oval in shape in cross section along a plane direction of the first substrate 110.

In this embodiment, the flexible base substrate 112 is made of a material containing transparent polyimide. The transparent polyimide, on one hand, has sufficient toughness and is configured as a main material of the flexible substrate 112 to improve bending resistance of the flexible substrate; one the other hand, since a molecular structure of the transparent polyimide adds a $CF_3$ group, an appearance of the transparent polyimide exhibits a transparent state, so that the light transmittance of the flexible substrate 112 and the first substrate 110 can be improved. The molecular structure of the transparent polyimide is as follows:

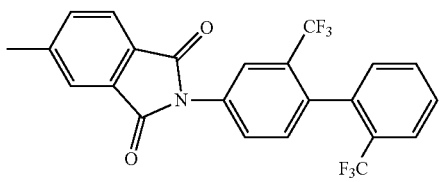

Figure 3:
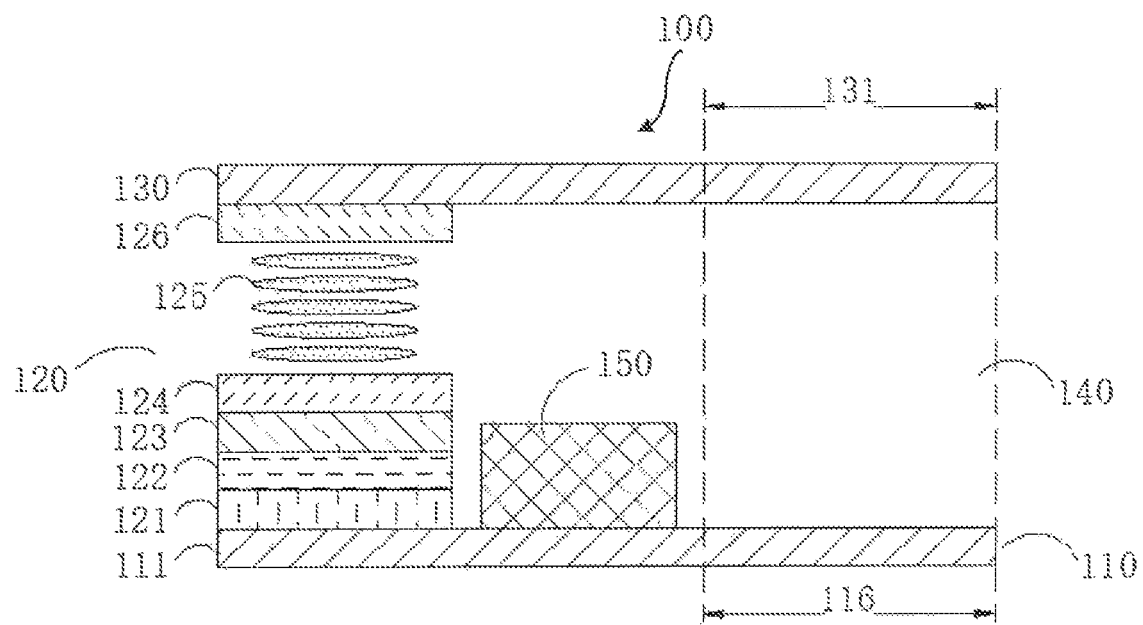
FIG. 3 is a schematic structural view showing a cross-section taken along line A-A of a display panel of the first embodiment of the present disclosure.

As shown in FIG. 3, FIG. 3 is a schematic structural view showing a cross-section taken along line A-A of the display panel 100 of the embodiment of the present disclosure. The camera assembly 120 includes a wire connecting substrate 121, an image sensor 122, an infrared filter 123, a focus motor 124, and a lens unit 125 are all sequentially disposed in a stacked arrangement. The lens unit 125 is composed of a plurality of units of lenses for concentrating light reflected by photographed objects on the image sensor 122. The focus motor 124 is configured to drive the lens unit 125 to move for zooming and focusing. The infrared filter 123 is configured to filter infrared rays, preventing the image sensor 122 from sensing infrared rays and failing to display correct color normally. The image sensor 122 is configured to convert an optical image collected by the lens unit 125 into an electrical signal. The wire connecting substrate 121 is configured to connect the image sensor 122 and the display panel 100, and to transmit the electrical signal of the image sensor 122 to the display panel 100.

Specifically, as shown in FIG. 3, the lens unit 125 is disposed on a side of the display panel away from the first substrate 110. The wire connecting substrate 121 is disposed on a side adjacent to the first substrate 110. A backplate 130 is disposed on a side of the lens unit 125 away from the first substrate 110. A protection lens 126 is disposed between the lens unit 125 and the backplate 130, and the protection lens 126 is configured to protect the lens unit 125.

Specifically, as shown in FIG. 3, a transparent area 131 is defined on the backplate 130. A second display area 116 is defined on an area where the display area 111 faces the transparent area 131. A transparent viewing window 140 is defined by both the second display area 116 and the transparent area 131. The transparent viewing window 140 further includes an empty area formed between the transparent area 131 and the second display area 116. The empty area is configured to be empty without any components disposed in the empty area. The second display area 116 is configured to display an image captured by the camera assembly 120, and the transparent viewing window 140 is configured to enable viewing of the image through the transparent area 131.

In a shooting process performed by the camera assembly 120, since the transparent viewing window 140, the transparent area 131, and the display area 111 are all made of transparent materials or transparent layers, images captured by the camera assembly 120 and displayed by the second display area 116 can be viewed through the transparent viewing window 140 from the transparent area 131 of the backplate 130 in a direction from the backplate 130 to the first substrate 110, thereby to achieve a function of selfie shooting by the rear-facing camera assembly 120 under a condition of eliminating front-facing camera components.

Preferably, the display panel 100 further includes a battery 150. The battery 150 is disposed in a portion between the first substrate 110 and the backplate 130 other than the transparent viewing window 140.

Preferably, the display panel 100 further includes and a chip (not shown), and the chip is disposed in a portion between the first substrate 110 and the backplate 130 other than the transparent viewing window 140.

Preferably, as shown in FIG. 2, the display area 111 further includes a polarizer 116, wherein the polarizer 116 is disposed on a side of the touch layer 115 away from the flexible base substrate 112. The polarizer 116 has a thickness between 140 microns (um) and 160 um, and the flexible base substrate 112 has a thickness between 45 um and 55 um.

Based on the embodiment of the present disclosure, the flexible base substrate 112 of the display area 111 of the first substrate 110 is formed as a transparent flexible base substrate to improve light transmittance of the first substrate 110, thereby realizing transparent displaying of the first substrate 110. Furthermore, the camera assembly 120 is disposed on a side of the display area 111 adjacent to the flexible base substrate 112, so that when displaying by default, the first substrate 110 displays images as normal, and when taking pictures, a portion of the display area 111 corresponding to the camera assembly 120 exhibits a transparent state, light passes through the first substrate 110 to the camera assembly 120 to enable image shooting, thereby achieving a configuration that the camera assembly 120 is disposed under the display area 111, and thus increasing a screen ratio of the display panel 110.

Embodiment 2

The embodiment of the present disclosure provides a display panel 200. The following disclosure is described in detail along with FIGS. 4 to 6.

Figure 4:
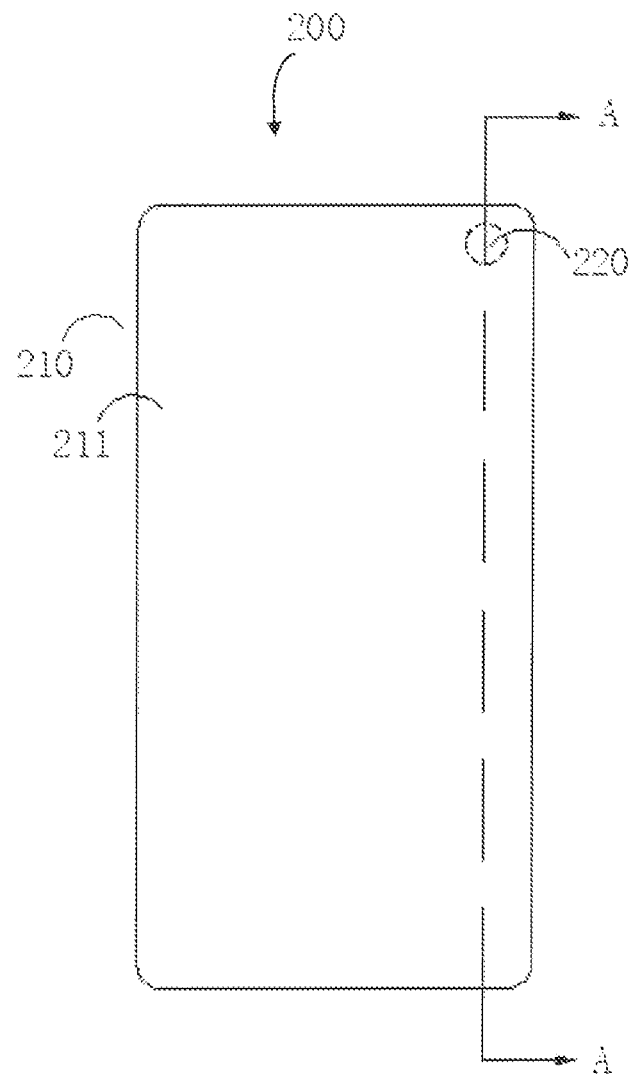
FIG. 4 is a schematic view of a display panel of a second embodiment of the present disclosure.

As shown in FIG. 4, FIG. 4 is a schematic plan view of the display panel 200 of the embodiment of the present disclosure. The display panel 200 includes a first substrate 210. The first substrate 210 includes a display area 211 and a non-display area (not shown).

Figure 5:
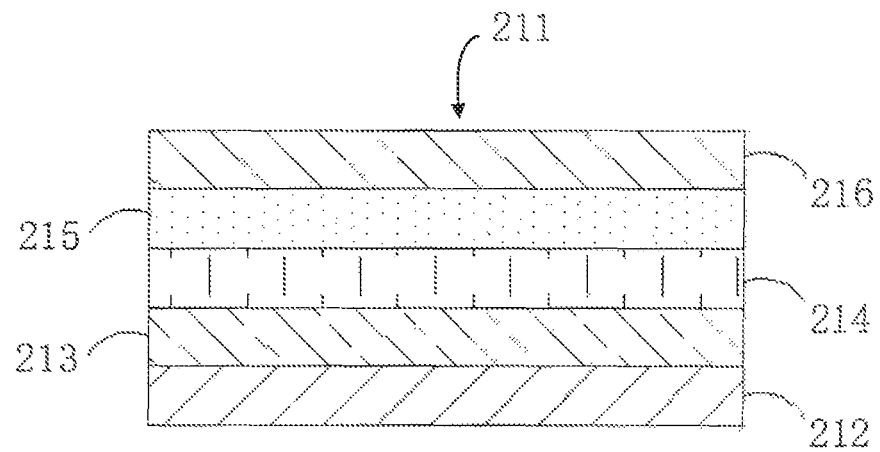
FIG. 5 is a schematic structural view showing a cross-section taken along line A-A of a display area of the second embodiment of the present disclosure.

Specifically, as shown in FIG. 5, FIG. 5 is a schematic structural view showing a cross-section taken along line A-A of the display area 211 of the second embodiment of the present disclosure. The display area 211 includes a flexible base substrate 212, a pixel array layer 213, a light-emitting layer 214, and a touch layer 215 all sequentially disposed in a stacked arrangement. The flexible base substrate 212 is a transparent flexible base substrate, and the pixel array layer 213, the light-emitting layer 214, and the touch layer 215 are all transparent layers, thereby to increase light transmittance of the display area 211.

As shown in FIG. 4, the display panel 200 further includes a camera assembly 220. The camera assembly 220 is disposed on a side of the display area 211 adjacent to the flexible base substrate 112.

Preferably, the camera assembly 220 is polygonal, circular, and oval in shape in cross section along a plane direction of the first substrate 210.

In this embodiment, the flexible base substrate 212 is made of a material containing transparent polyimide. The transparent polyimide, on one hand, has sufficient toughness and is configured as a main material of the flexible substrate 212 to improve bending resistance of the flexible substrate; one the other hand, since a molecular structure of the transparent polyimide adds a $CF_3$ group, an appearance of the transparent polyimide exhibits a transparent state, so that the light transmittance of the flexible substrate 212 and the first substrate 210 can be improved. The molecular structure of the transparent polyimide is as follows:

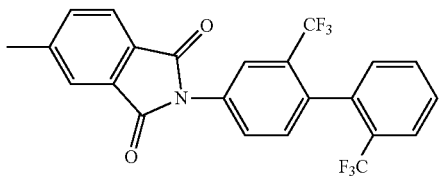

Figure 6:
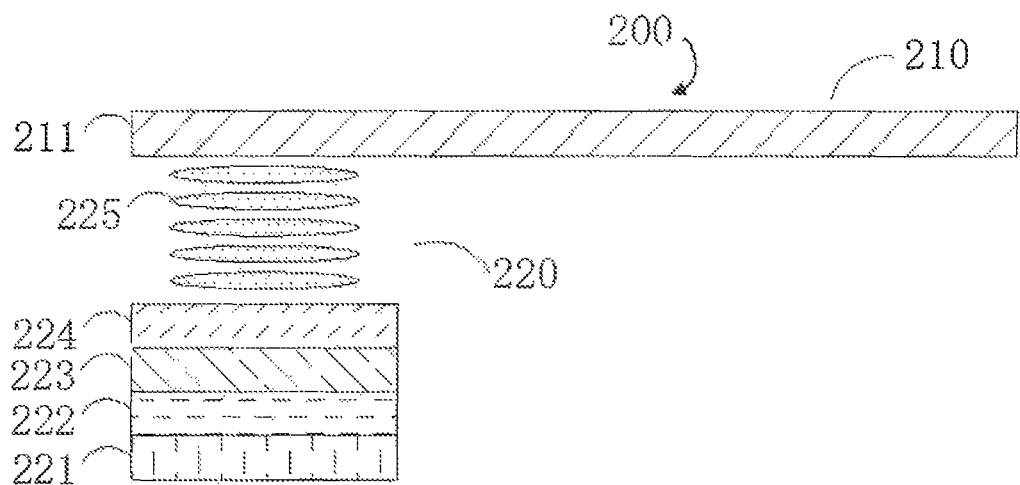
FIG. 6 is a schematic structural view showing a cross-section taken along line A-A of a display panel of the second embodiment of the present disclosure.

As shown in FIG. 6, FIG. 6 is a schematic structural view showing a cross-section taken along line A-A of the display panel 200 of the embodiment of the present disclosure. The camera assembly 220 includes a wire connecting substrate 221, an image sensor 222, an infrared filter 223, a focus motor 224, and a lens unit 225 are all sequentially disposed in a stacked arrangement. The lens unit 225 is composed of a plurality of units of lenses for concentrating light reflected by photographed objects on the image sensor 222. The focus motor 224 is configured to drive the lens unit 225 to move for zooming and focusing. The infrared filter 223 is configured to filter infrared rays, preventing the image sensor 222 from sensing infrared rays and failing to display correct color normally. The image sensor 222 is configured to convert an optical image collected by the lens unit 225 into an electrical signal. The wire connecting substrate 221 is configured to connect the image sensor 222 and the display panel 200, and to transmit the electrical signal of the image sensor 222 to the display panel 200.

Specifically, as shown in FIG. 6, the lens unit 225 is disposed on a side of the display panel adjacent to the first substrate 210. The wire connecting substrate 221 is disposed on a side away from the first substrate 210. In this manner, the first substrate 210 can also function as a protection for the lens unit 225 while displaying is performed. As a result, a protection lens can be omitted in this embodiment of the present disclosure.

When displaying by default, the display area 211 can display images as normal. In a shooting process performed by the camera assembly 220, a portion of the display area 211 corresponding to the camera assembly 220 is not provided to display an image under circuit control. Since the first substrate is transparent, light can pass through the first substrate to enter the lens unit 225 of the camera assembly 220, thereby a normal shooting of the camera assembly 220 under a screen can be fulfilled.

Preferably, as shown in FIG. 5, the display area 211 further includes a polarizer 216, wherein the polarizer 216 is disposed on a side of the touch layer 215 away from the flexible base substrate 212. The polarizer 216 has a thickness between 140 microns (um) and 160 um, and the flexible base substrate 212 has a thickness between 45 um and 55 um.

Based on the embodiment of the present disclosure, the flexible base substrate 212 of the display area 211 of the first substrate 210 is formed as a transparent flexible base substrate to improve light transmittance of the first substrate 210, thereby realizing transparent displaying of the first substrate 210. Furthermore, the camera assembly 220 is disposed on a side of the display area 211 adjacent to the flexible base substrate 212, so that when being displayed by default, the first substrate 210 displays a normal image, and when taking pictures, the display area 211 corresponding to the camera assembly 220 exhibits a transparent state, light passes through the first substrate 210 to the camera assembly 220 to enable image shooting, thereby achieving a configuration that the camera assembly 220 is disposed under the display area 211, and thus increasing a screen ratio of the display panel 210.

The present disclosure further provides a display device including the display panel as described in the aforementioned embodiments, and the display device can achieve technical effects the same as that of the above display panel, and details are not described herein again.

Accordingly, although the present invention has been disclosed as a preferred embodiment, it is not intended to limit the present invention. Those skilled in the art without departing from the scope of the present invention may make various changes or modifications, and thus the scope of the present invention should be after the appended claims and their equivalents.

What is claimed is:

1. A display panel, comprising:
   a first substrate comprising a display area and a non-display area, wherein the display area comprises a flexible base substrate, a pixel array layer, a light-emitting layer, and a touch layer all sequentially disposed in a stacked arrangement, wherein the flexible base substrate is a transparent flexible base substrate and is made of a material containing transparent polyimide having a molecular structural formula as follows:

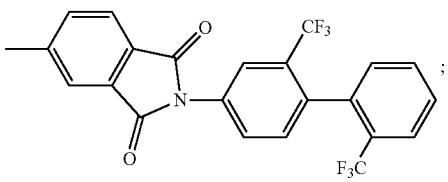 [SMILES: Cc1ccc2c(c1)C(=O)N(c1ccc(-c3ccccc3C(F)(F)F)c(C(F)(F)F)c1)C2=O]
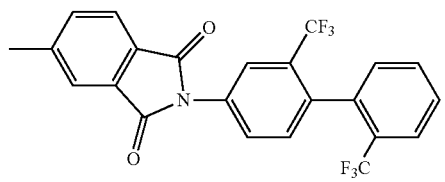 [SMILES: Cc1ccc2c(c1)C(=O)N(c1ccc(-c3ccccc3C(F)(F)F)c(C(F)(F)F)c1)C2=O]

and
   a camera assembly disposed on a side of the display area adjacent to the flexible base substrate.

2. The display panel of claim 1, wherein the camera assembly comprises a wire connecting substrate, an image sensor, an infrared filter, a focus motor, and a lens unit are all sequentially disposed in a stacked arrangement.

3. The display panel of claim 2, wherein the lens unit is disposed away from the first substrate, and the wire connecting substrate is disposed on a side adjacent to the first substrate.

4. The display panel of claim 3, wherein a backplate is disposed on a side of the lens unit away from the first substrate, a protection lens is disposed between the lens unit and the backplate, and the protection lens is configured to protect the lens unit.

5. The display panel of claim 4, wherein a transparent area is defined on the backplate, a second display area is defined on an area where the display area faces the transparent area, and a transparent viewing window is defined by both the second display area and the transparent area, wherein the second display area is configured to display an image captured by the camera assembly, and the transparent viewing window is configured to enable viewing of the image through the transparent area.

6. The display panel of claim 5, further comprising a battery and a chip, wherein the battery and the chip are disposed in a portion between the first substrate and the backplate other than the transparent viewing window.

7. The display panel of claim 2, wherein the lens unit is disposed on a side of the display panel adjacent to the first substrate, and the wire connecting substrate is disposed on a side of the display panel away from the first substrate.

8. The display panel of claim 1, further comprising a polarizer, wherein the polarizer is disposed on a side of the touch layer away from the flexible base substrate, the polarizer has a thickness between 140 microns (um) and 160 um, and the flexible base substrate has a thickness between 45 um and 55 um.

9. A display panel, comprising:
   a first substrate comprising a display area and a non-display area, wherein the display area comprises a flexible base substrate, a pixel array layer, a light-emitting layer, and a touch layer all sequentially disposed in a stacked arrangement, and the flexible base substrate is a transparent flexible base substrate; and
   a camera assembly disposed on a side of the display area adjacent to the flexible base substrate, and comprising a wire connecting substrate, an image sensor, an infrared filter, a focus motor, and a lens unit all sequentially disposed in a stacked arrangement;
   wherein the lens unit is disposed on a side of the display panel away from the first substrate, and the wire connecting substrate is disposed on a side of the display panel adjacent to the first substrate.

10. The display panel of claim 9, wherein the flexible base substrate is made of a material containing transparent polyimide having a molecular structural formula as follows:

11. The display panel of claim 10, wherein a backplate is disposed on a side of the lens unit away from the first substrate, a protection lens is disposed between the lens unit and the backplate, and the protection lens is configured to protect the lens unit.

12. The display panel of claim 11, wherein a transparent area is disposed on the backplate, a second display area is defined in an area where the display area faces the transparent area, and a transparent viewing window is defined by both the second display area and the transparent area, wherein the second display area is configured to display an image captured by the camera assembly, and the transparent viewing window is configured to enable viewing of the image through the transparent area.

13. The display panel of claim 12, further comprising a battery and a chip, wherein the battery and the chip are disposed in a portion between the first substrate and the backplate other than the transparent viewing window.

14. The display panel of claim 9, wherein the lens unit is disposed on a side of the display panel adjacent to the first substrate, and the wire connecting substrate is disposed on a side of the display panel away from the first substrate.

15. The display panel of claim 9, further comprising a polarizer, wherein the polarizer is disposed on a side of the touch layer away from the flexible base substrate, the polarizer has a thickness between 140 microns (um) and 160 um, and the flexible base substrate has a thickness between 45 um and 55 um.

16. A display device, comprising a display panel, the display panel comprising:
   a first substrate comprising a display area and a non-display area, wherein the display area comprises a flexible base substrate, a pixel array layer, a light-emitting layer, and a touch layer all sequentially disposed in a stacked arrangement, wherein the flexible base substrate is a transparent flexible base substrate and is made of a material containing transparent polyimide having a molecular structural formula as follows:

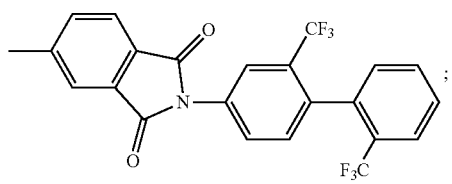 [SMILES: Cc1ccc2c(c1)C(=O)N(c1ccc(-c3ccccc3C(F)(F)F)c(C(F)(F)F)c1)C2=O]

and
   a camera assembly disposed on a side of the display area adjacent to the flexible base substrate.

17. The display device of claim 16, wherein the camera assembly comprises a wire connecting substrate, an image sensor, an infrared filter, a focus motor, and a lens unit are all sequentially disposed in a stacked arrangement.

18. The display device of claim 17, wherein the lens unit is disposed on a side of the display panel away from the first substrate, and the wire connecting substrate is disposed on a side of the display panel adjacent to the first substrate.

* * * * *